United States Patent
Clewell et al.

(10) Patent No.: US 8,472,202 B1
(45) Date of Patent: Jun. 25, 2013

(54) SYSTEM FOR CONNECTING ELECTRICAL CABLES TO A PRINTED CIRCUIT BOARD

(75) Inventors: Craig William Clewell, Harrisburg, PA (US); Bruce Champion, Camp Hill, PA (US); Eric David Briant, Dillsburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 30 days.

(21) Appl. No.: 13/311,742

(22) Filed: Dec. 6, 2011

(51) Int. Cl.
*H05K 1/00* (2006.01)

(52) U.S. Cl.
USPC .............. 361/748; 439/579; 439/63; 439/581

(58) Field of Classification Search
USPC ...................... 361/748; 439/579, 497, 63, 581
See application file for complete search history.

(56) References Cited

U.S. PATENT DOCUMENTS

| | | | |
|---|---|---|---|
| 6,053,770 A | 4/2000 | Blom | |
| 6,338,653 B1 * | 1/2002 | Jones et al. | 439/579 |
| 6,722,915 B1 | 4/2004 | McAlonis | |
| 6,869,308 B2 * | 3/2005 | Wu | 439/497 |

FOREIGN PATENT DOCUMENTS

EP   0 971 441   1/2000

* cited by examiner

*Primary Examiner* — Timothy Thompson
*Assistant Examiner* — Andargie M Aychillhum

(57) ABSTRACT

An electrical communication system includes a printed circuit board (PCB) having first and second ground plates and a plurality of signal vias and a plurality of ground vias extending between and through the first and second ground plates. Each of the plurality of signal vias are electrically connected to a respective conductive trace on a surface of the PCB. Cables connect to the PCB at a right angle, with a connector attached to an opposite side of the PCB. Each cable has two signal wires and a ground wire extending therefrom. The two signal wires define a differential pair. The signal wires are symmetrical with respect to the ground wire. Each of the signal wires electrically connects to a respective one of the plurality of signal vias. The ground wire connects to one of the plurality of ground vias. The cables are offset with respect to one another on the first and second ground plates and within the PCB.

21 Claims, 7 Drawing Sheets

US 8,472,202 B1

SYSTEM FOR CONNECTING ELECTRICAL CABLES TO A PRINTED CIRCUIT BOARD

BACKGROUND

The subject matter herein relates generally to a system for electrically connecting electrical cables to a printed circuit board.

Various communication or computing systems use electrical connectors to transmit data signals between different components of the systems. An electrical connector may mechanically and electrically connect to a printed circuit board, for example. Typically, the printed circuit board includes conductive pads on a planar surface. Conductive wires extending from cables are soldered to the conductive pads in order to connect the printed circuit board to another component, such as another printed circuit board, connector, or the like.

However, each printed circuit board has a limited amount of space in which to position wires, traces, and the like. Often, differential pair signaling is used with respect to electrical systems. A cable may include signal wires and a ground or drain wire. The cable may connect to the printed circuit board.

Typically, a differential pair includes a positive signal wire and a negative signal wire. Each of the positive and negative signal wires are soldered to pads on the printed circuit board. The ground wire is typically soldered to the board in order to shield the differential pair from another differential pair. Because space is limited on the printed circuit board, the ground wire is often soldered to the printed circuit board and routed to the cable on the surface of the printed circuit board in a circuitous manner. In doing so, however, the signal wires may not be symmetrical about the drain wire. An asymmetric relationship between the signal wires and the drain wire typically leads to a signaling imbalance between the signal wires. That is, a positive differential signal may not be the exact opposite of a negative differential signal, or vice versa. Therefore, larger printed circuit boards may be used so that the drain wires can be directly soldered to pads on the board with the signal wires being symmetrical with respect to the drain wire. Unfortunately, however, use of larger printed circuit boards within a confined space of an application, such as within a computer system, may not be possible.

Additionally, directly soldering the wires to pads on the printed circuit board takes up additional space. Attempts to directly solder the wires to the printed circuit board may prove difficult or even impossible. Further, the increased amount of solder between closely bunched signal traces on the printed circuit board may degrade signal integrity. That is, when neighboring differential signal pairs are too close to one another, the neighboring differential signal pairs are susceptible to cross-talk and interference, which degrades signal integrity.

In general, as data rates continue to increase, there is a need to control electrical noise through cable assemblies in order to achieve desired performance. Often, the cables are terminated to printed circuit boards in order to create a connection between the cables and the printed circuit boards. In very small, miniaturized connectors, the area used to terminate the cables to the printed circuit boards is typically extremely small. As such, the cables may be in close proximity to one another. However, as the cables get closer to each other, noise and cross-talk between the cables increases. If the noise and cross-talk exceed a particular threshold, the cables are unable to operate as intended.

SUMMARY

Certain embodiments provide an electrical communication system including a printed circuit board (PCB) having first and second ground plates and first, second, third, and fourth signal vias and first and second ground vias extending between the first and second ground plates. The first, second, third, and fourth signal vias are electrically connected to first, second, third, and fourth conductive traces, respectively, on a surface of the first ground plate.

The system also includes a first cable having first and second signal wires and a first ground wire extending therefrom. The first and second signal wires define a first differential pair. The first and second signal wires are symmetrical with respect to the ground wire. The first and second signal wires electrically connect to the first and second signal vias, respectively. The first ground wire connects to a first ground via.

The system also includes a second cable having third and fourth signal wires and a second ground wire extending therefrom. The third and fourth signal wires define a second differential pair. The third and fourth signal wires are symmetrical with respect to the ground wire. The third and fourth signal wires electrically connect to third and fourth signal vias, respectively. The second ground wire connects to a second ground via.

The first cable, including the first differential pair, is offset with respect to the second cable, including the second differential pair, on the first and second ground plates and within the PCB with respect to at least one of two orthogonal axes.

The system may also include an electrical connector mounted on the first ground plate of the PCB. The electrical connector may include first, second, third, and fourth differential contact tails that electrically connect to the first, second, third, and fourth conductive traces, respectively.

The PCB may also include a plurality of shielding ground vias extending between the first and second ground plates. At least a portion of the plurality of shielding ground vias may be positioned between the first and second differential pairs within the PCB. A first set of the plurality of shielding ground vias may surround at least a portion of the first differential pair within the PCB. A second set of the plurality of shielding ground vias may surround at least a portion of the second differential pair within the PCB.

The PCB may also include a first air pocket surrounding the first and second signal vias between the first and second ground plates, and a second air pocket surrounding the third and fourth signal vias between the first and second ground plates.

The system may also include at least one shielding member extending from the second ground plate. The shielding member may be positioned between the first and second cables. The shielding member may be a planar plate formed of conductive plastic or metal.

The system may also include a molded plastic cover over at least a portion of the PCB. The system may also include a non-conductive mask disposed between at least a portion of the PCB and the molded plastic cover.

Certain embodiments provide an electrical communication system including a printed circuit board (PCB) having first and second ground plates and a plurality of signal vias and a plurality of ground vias extending between the first and second ground plates. Each of the plurality of signal vias may be electrically connected to a respective conductive trace on a surface of the PCB.

The system may also include cables connecting to the PCB. Each of the cables has two signal wires and a ground wire extending therefrom. The two signal wires define a differential pair. The two signal wires are symmetrical with respect to the ground wire, wherein each of the two signal wires electrically connects to a respective one of the plurality of signal vias. The ground wire connects to one of the plurality of ground vias. The cables are offset with respect to one another on the first and second ground plates and within the PCB.

The PCB may also include a plurality of shielding ground vias extending between the first and second ground plates. At least a portion of the plurality of shielding ground vias may be positioned between neighboring differential pairs within the PCB. A first set of the plurality of shielding ground vias may surround at least a portion of a first neighboring differential pair within the PCB. A second set of the plurality of shielding ground vias may surround at least a portion of a second neighboring differential pair within the PCB.

The PCB may also include air pockets or anti-pads of dielectric material surrounding each of the plurality of signal vias between the first and second ground plates.

The system may also include at least one shielding member extending from the second ground plate. The shielding member may be positioned between neighboring cables.

DETAILED DESCRIPTION

Figure 1:
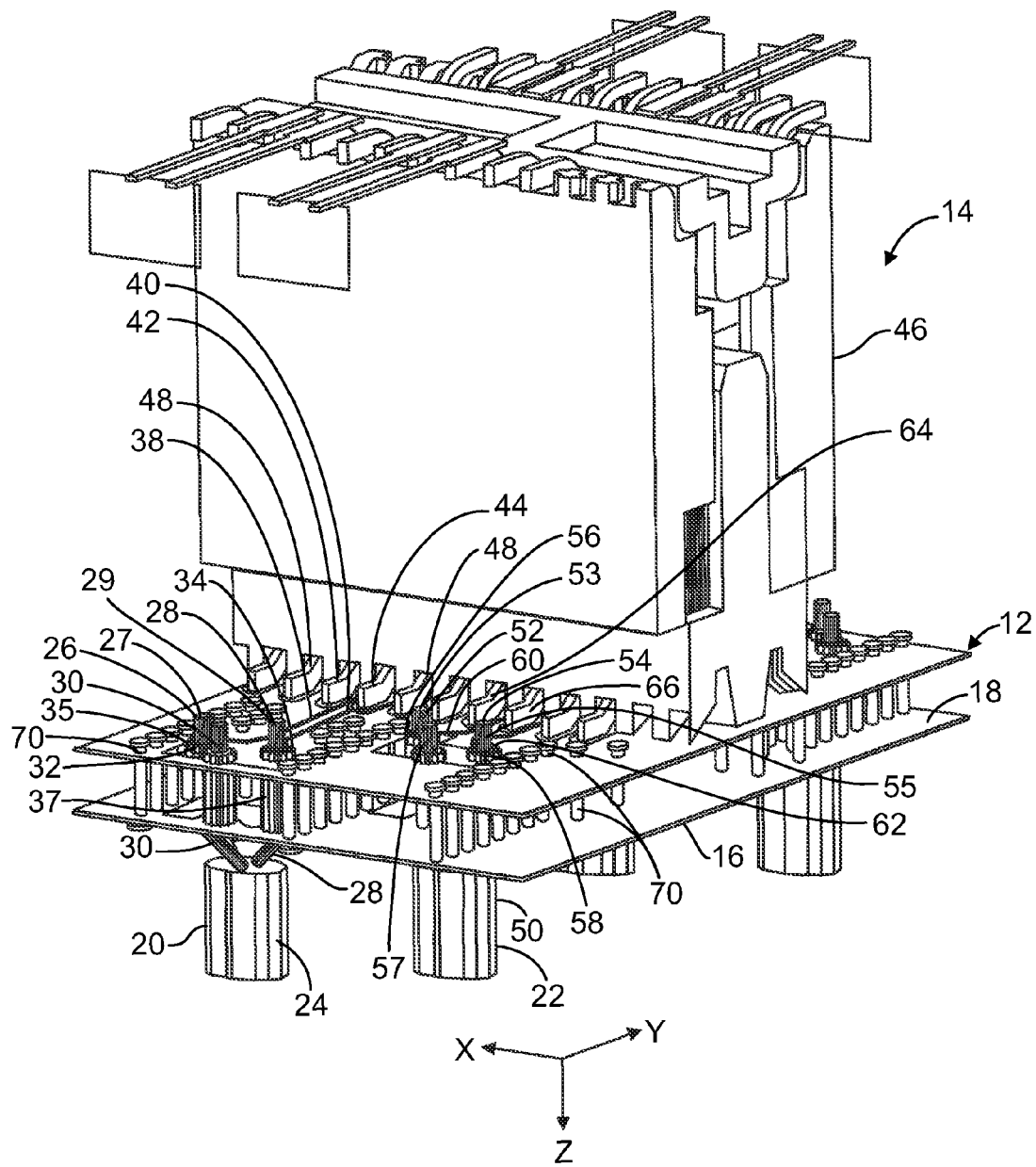
FIG. 1 illustrates a perspective view of a communication system, according to an embodiment.

FIG. 1 illustrates a perspective view of a computing or communication system 10, according to an embodiment. The system 10 includes a printed circuit board (PCB) 12 electrically connected to an electrical connector 14, which may, in turn, be electrically connected to another electrical component (not shown), such as another PCB.

The PCB 12 includes first and second planar ground planes 16 and 18 aligned with, and spaced from, one another. A dielectric material (not shown) is positioned between and extends past the ground planes 16 and 18.

Cables 20 and 22 connect to the PCB 12 on a side opposite the electrical connector 14, and at a right angle to the PCB 12. The cable 20 includes an insulated sheath 24 that retains signal wires 26 and 28 and a ground wire 30. The signal wires 26 and 28 form a differential pair. A differential pair is a pair of conductors used for differential signaling. In general, differential pairs minimize crosstalk and electromagnetic interference. Additionally, differential pairs are well-suited for high speed data transmission. The signal wire 26 may be a positive signal wire, while the signal wire 28 may be a negative signal wire, or vice versa.

Proximal ends 27 and 29 of the signal wires 26 and 28, respectively, extend from the cable 20 in the direction of mating axis Z and connect to the PCB 12 through signal vias 32 and 34, respectively. Instead of being soldered to pads on the outer surface of the PCB 12, the proximal ends 27 and 29 of the signal wires 26 and 28, respectively, are soldered into the signal vias 32 and 34, respectively, forming a right angle with respect to the PCB 12.

Each via 32 and 34 is a vertical electrical connection through, but not connected to, the ground plates 16 and 18. The signal vias 32 and 34 allow for a conductive connection between the PCB 12 and the signal wires 26 and 28. Each via 32 and 34 may include a pad 35 on the surface signal layer (not shown) on either side of the PCB 12. The aligned pads 35 are connected by a conductive barrel 37 having a central conductive passage formed therethrough. The proximal ends 27 and 29 of the signal wires 26 and 28, respectively, pass through the pad 35 on the surface of the PCB 12, into the conductive barrel 37, and out through the conductive pad 35 on the opposite side of the PCB 12. The proximal ends 27 and 29 may be soldered to the signal vias 32 and 34, respectively, within the conductive barrels 37.

The pads 35 of the signal vias 32 and 34 are electrically connected to conductive traces 38 and 40, respectively, on the surface of the PCB 12. The traces 38 and 40 extend over the surface of the PCB 12 parallel to a plane defined by lateral axis X and longitudinal axis Y (with the axes X and Y being orthogonal to one another). The traces 38 and 40 electrically connect to differential signal contact tails 42 and 44, respectively, of signal contacts which extend out of a main housing 46 of the electrical connector 14. Ground tails 48 of ground contacts are positioned on either side of the differential pair having the differential signal contact tails 42 and 44.

The electrical connector 46 may be any type of electrical connector used to electrically connect the PCB 12 to another electrical component. For example, the electrical connector 46 may be a plug or receptacle connector that is used to electrically and mechanically connect an electrical component to the PCB 12, such as shown and described with respect to U.S. application Ser. No. 13/288,117, entitled "Multiple Communication Protocol Electrical Connector Assembly," filed Nov. 3, 2011, and U.S. application Ser. No. 13/289,088, entitled "Electrical Connector Assembly Having High Speed Signal Pairs," filed Nov. 4, 2011, both of which are hereby incorporated by reference in their entireties.

Similarly, the cable 22 includes an insulated sheath 50 that retains signal wires 52 and 54 and a ground wire 57. The signal wires 52 and 54 form a differential pair. The signal wire 52 may be a positive signal wire, while the signal wire 54 may be a negative signal wire, or vice versa.

Proximal ends 53 and 55 of the signal wires 52 and 54, respectively, extend from the cable 22 in the direction of mating axis Z and connect at a right angle to the PCB 12 through signal vias 56 and 58, respectively. The proximal ends 53 and 55 are soldered to the signal vias 56 and 58, respectively, as discussed above with respect to the signal wires 26 and 28 and the signal vias 32 and 34.

The signal vias 56 and 58 are electrically connected to conductive traces 60 and 62, respectively, on a surface layer of the PCB 12. The traces 60 and 62 electrically connect to differential signal contact tails 64 and 66, respectively, which extend out of the main housing 46 of the electrical connector 14. Ground tails 48 are positioned on either side of the differential pair of differential signal contact tails 64 and 66.

As shown in FIG. 1, the differential pair defined by the signal wires 26 and 28 is staggered or offset with respect to the differential pair defined by the signal wires 52 and 54 on and within the PCB 12. That is, the signal wires 26 and 28 are not linearly aligned with the signal wires 52 and 54 with respect to the axis X or the axis Y. Instead, as shown, the differential pairs are positioned at different distances with respect to the axis Y from the electrical connector 14 on and within the PCB 12. Further, multiple shielding ground vias 70 are disposed on either side of each differential pair. The ground vias 70 between the differential pairs shield the differential pairs from one another, thereby reducing or eliminating cross-talk between the differential pairs.

The differential pair wires as defined above connect to the electrical connector in a right-angle manner in relation to the PCB 12. That is, the signal wires 26, 28, 52, and 54 and the ground wires 30 and 57 extend from the cables 20 and 22, respectively, in a direction that is parallel to the mating axis Z, into the PCB 12. The signal wires 26, 28, 52, and 54 are soldered into vias 32, 34, 56 and 58, respectively, that connect to conductive traces 38, 40, 60 and 62 that are oriented on the PCB 12 parallel with the longitudinal axis Y, which is orthogonal to the mating axis Z.

Figure 2:
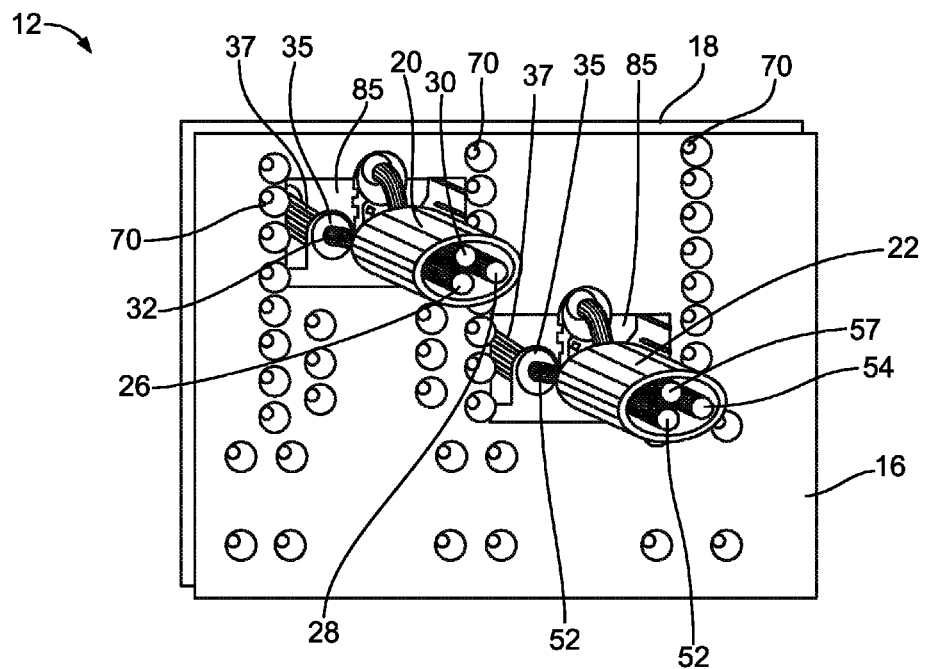
FIG. 2 illustrates a bottom perspective view of a printed circuit board, according to an embodiment.
Figure 3:
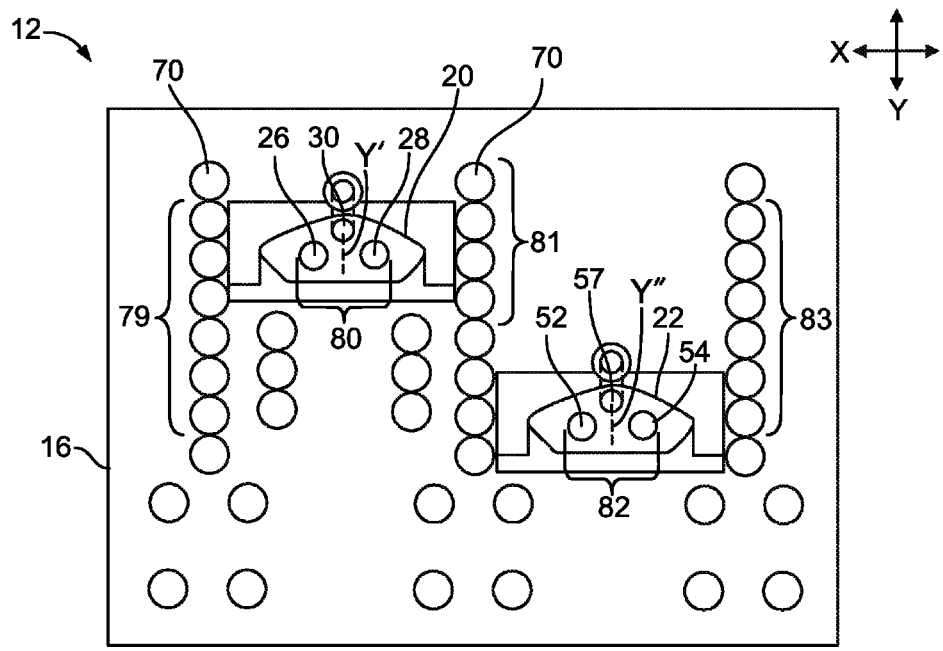
FIG. 3 illustrates a bottom view of a printed circuit board, according to an embodiment.

FIG. 2 illustrates a bottom perspective view of the printed circuit board 12. FIG. 3 illustrates a bottom view of the printed circuit board 12. Each of the cables 20 and 22 may be a twin-axial cable having twin axes defined by the signal wires 26, 28, and the signal wires 52 and 54.

Referring to FIGS. 2 and 3, the differential pair 80 defined by the signal wires 26 and 28 is symmetrical about a longitudinal axis Y' that bisects the ground wire 30. Similarly, the differential pair 82 defined by the signal wires 52 and 54 is symmetrical about a longitudinal axis Y" that bisects the ground wire 57. Because the signal wires 26 and 28 are symmetrical with respect to the ground wire 30, and the signal wires 52 and 54 are symmetrical with respect to the ground wire 57, the differential pairs 80 and 82 provide a balanced differential signal. That is, a positive signal is equal, but opposite polarity, to the negative signal, and vice versa Unbalanced signals would be created by attaching the ground wire closer to the positive or negative signal wire, thereby causing an asymmetrical relationship.

Moreover, as shown FIG. 3, in particular, the differential pair 80 is offset or staggered with respect to the differential pair 82. The differential pairs 80 and 82 are not linearly aligned with respect to either the axis X or Y. In this manner, cross-talk between the differential pairs 80 and 82 is reduced or otherwise eliminated because the differential pairs 80 and 82 are spread out over and within the PCB 12. The differential pairs 80 and 82 are able to be spread out with respect to the connector 14 because they are not directly soldered to pads or traces that are on the same small pitch as the connector 14 on the surface of the PCB 12. Therefore, the cables can be mechanically attached to the PCB 12 on a pitch that is greater than the pitch of the connector 14. In general, it may not be possible to attach the wires on the same pitch as, and in alignment with, the connector 14 with respect to the X and Y axes due to the overall diameter of the wires that are larger than the pitch of the connector 14. Instead, the signal wires of the differential pairs 80 and 82 are soldered into the confined and controlled barrels 37 of the vias, which prevents solder from flowing into an adjacent differential pair or ground connection on the PCB 12. Therefore, embodiments provide a system that minimizes or eliminates cross-talk between differential pairs, while maintaining signal integrity, such as at 24 Gb/s, in contrast to prior systems that include wires soldered directly to pads on surface of a printed circuit board, which may degrade signal integrity.

As noted above, the shielding ground vias 70 also shield the differential pairs 80 and 82 from one another. More or less ground vias 70 may be used. For example, each differential pair 80 and 82 may be completely surrounded by ground vias 70. Further, the system may include more differential pairs than those shown.

A set 79 of the ground vias 70 may be proximate an outer side of the differential pair 80 within the PCB 12, while another set 81 of the ground vias 70 may be proximate an inner side of the differential pair 80 within the PCB 12. Similarly, a set 83 of the ground vias 70 may be proximate an outer side of the differential pair 82 within the PCB 12, while the other set 81 of the ground vias may be proximate the inner side of the differential pair 82 within the PCB 12.

The wires of each of the signal wires 26, 28, 52, and 54, as well as the ground wires 30 and 57 may be formed of a relatively heavy gauge wire, such as #30AWG, that might otherwise prove difficult to directly solder to contact pads on a miniaturized printed circuit board. Because the differential pairs 80 and 82 are spread apart and offset with respect to one another, and the signal wires are connected to vias, as opposed to being directly soldered to pads, there is more space on the PCB 12. Moreover, because the differential pairs 80 and 82 are spread apart from one another, cross-talk and interference is reduced or eliminated. Accordingly, the PCB 12 may accommodate additional communication components, such as additional differential pairs.

As shown in FIG. 2, in particular, the PCB 12, including the ground plate 16, may have air pockets or anti-pads 85 positioned around at least portions of the vias 32, 34 (hidden from view), 56, and 58 (hidden from view). In this manner, the impedance of the differential pairs 80 and 82 within the PCB 12 may be controlled. Because air or dielectric material surrounds the vias 32, 34, 52, and 54, there is less dielectric material surrounding the vias 32, 34, 56, and 58, and a greater amount of air exposed thereto. For example, air has a dielectric constant of 1, which is substantially less than the dielectric constant of plastic (approximately 3.50). A higher dielectric constant results in a lower impedance and slower signal propagation. Therefore, lowering the dielectric constant by surrounding the vias 32, 34, 56, and 58 with the air pockets 85, instead of the dielectric material of the PCB 12, results in a higher impedance with respect to the differential pairs 80 and 82 and faster signal propagation. As noted above, however, dielectric anti-pads may surround the vias 32, 34, 56, and 58 within the PCB 12. The surrounding dielectric material may form anti-pads around the vias 32, 34, 56, and 58. The size and shape of the anti-pads controls the impedance within the PCB 12. For example, the smaller the anti-pad, the lower the resulting impedance.

Figure 4:
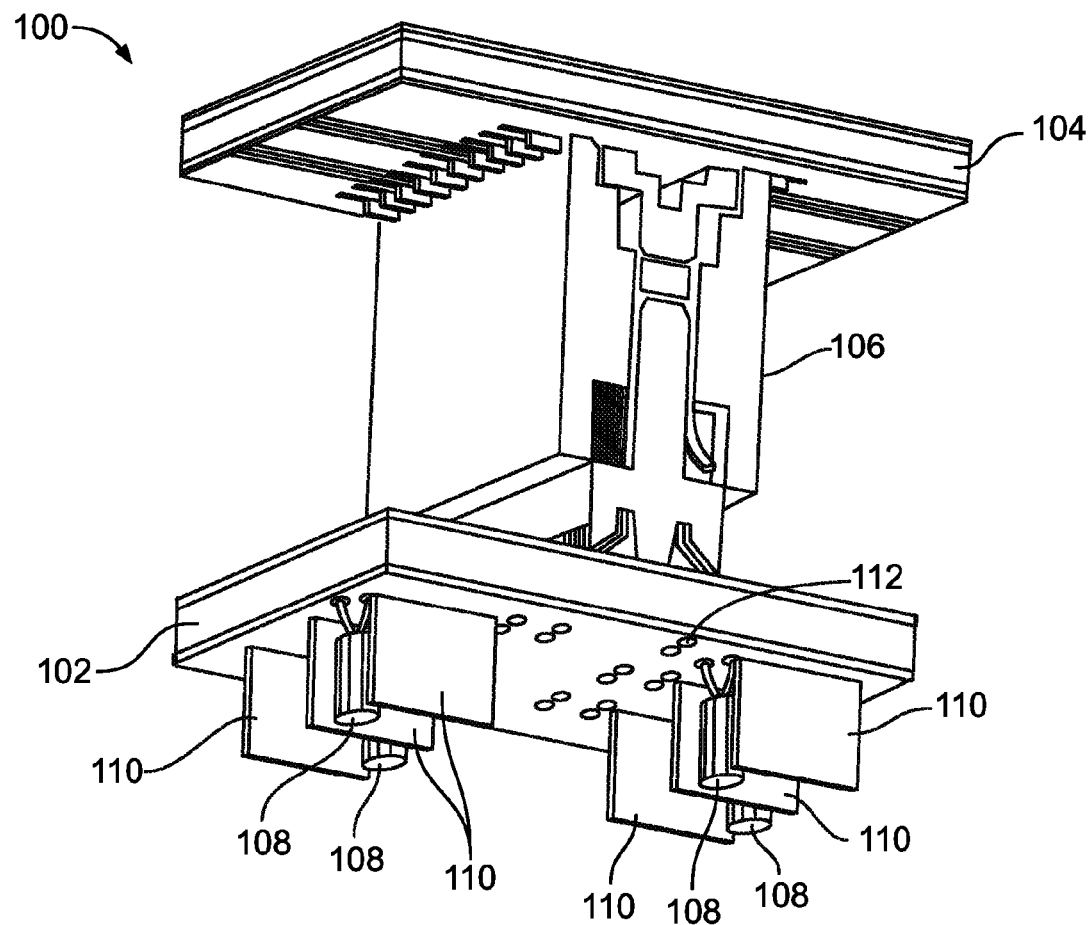
FIG. 4 illustrates a perspective view of a communication system, according to an embodiment.

FIG. 4 illustrates a perspective view of a communication system 100, according to an embodiment. The system 100 includes a PCB 102 connected to another PCB 104 through an electrical connector 106. The PCBs 102 and 104 and the electrical connector 106 may be configured as discussed above with respect to FIGS. 1-3.

Cables 108 connect to the PCB 102, as described above with respect to FIGS. 1-3. As discussed above, the cables 108 may retain signal wires symmetrically positioned with respect to a ground wire. Accordingly, the cables 108 may be differential signal cables. Cables (not shown) may also connect to the PCB 104.

Shielding members 110, such as planar plates, tabs, walls, or the like, extend from a surface of the PCB 102. The shielding members 110 may be formed of a conductive plastic, metal, such as copper, or the like. The shielding members 110 are disposed between neighboring cables 108, and act to shield the neighboring cables from interfering noise, crosstalk, and the like. Thus, the shielding members 110 provide additional protection against noise, crosstalk, and the like in addition to the staggered, offset positioning of the differential pairs on and within the PCB 102, and the shielding ground vias 112 (similar to the shielding ground vias 70). While not shown, shielding members may also extend from the PCB 104.

Figure 5:
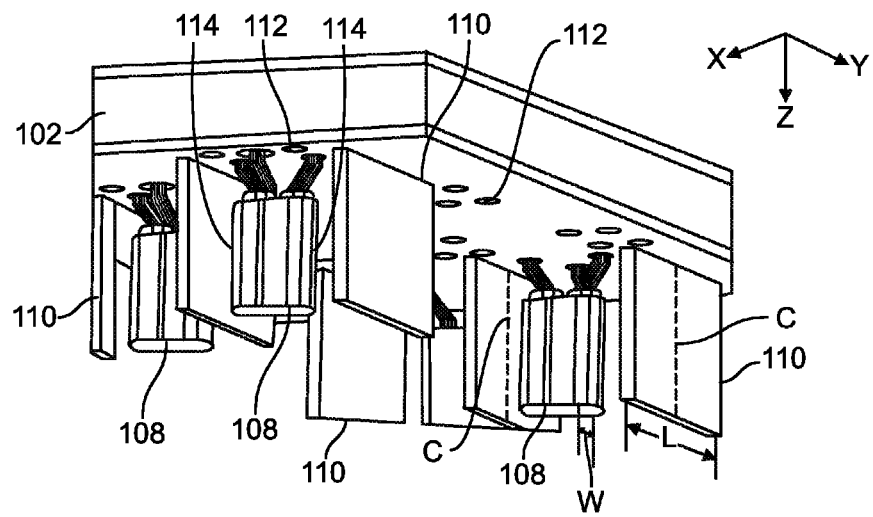
FIG. 5 illustrates a bottom perspective view of a printed circuit board, according to an embodiment.

FIG. 5 illustrates a bottom perspective view of the PCB 102. The shielding members 110 extend downwardly from the PCB 102 in a direction that is parallel with the mating axis Z. Each shielding member 110 may be a planar sheet or panel. As shown in FIG. 5, a shielding member 110 may be positioned on either lateral side 114 of each cable 108. The length L of each shielding member 108 may be substantially greater than the width W of each cable 108. Moreover, the cables 108 may be oriented with respect to adjacent shielding members 110 (that is, the two shielding members that shield each cable 108) along a vertical plane that is aligned with or proximate a central axis C of each adjacent shielding member 110. Therefore, adjacent shielding members 110 may provide the greatest shielding for each cable 108. However, the shielding members 110 may be positioned in various other positions with respect to the cables 108.

Figure 6:
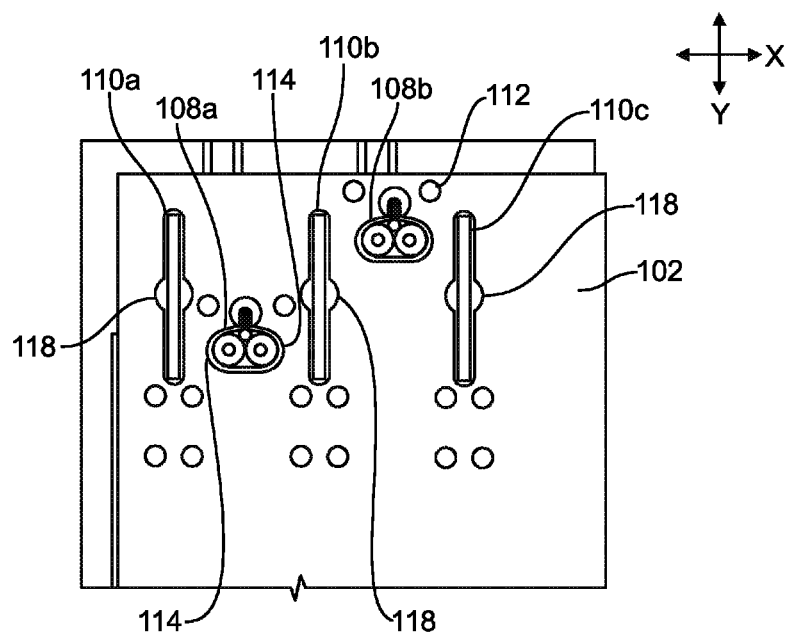
FIG. 6 illustrates a bottom view of a printed circuit board, according to an embodiment.

FIG. 6 illustrates a bottom view of the printed circuit board 102, according to an embodiment. As shown, adjacent shielding members 110a and 110b shield cable 108a, while adjacent shielding members 110b and 110c shield cable 108b. The shielding member 110b shields the cables 108a and 108b from one another.

Each shielding member 110a, 110b, and 110c may be secured to a ground via 118. For example, each shielding member 110a, 110b, and 110c may include a column or post that is securely retained, such as through a snap or interference fit, soldering, or the like, within a barrel of a ground via 118. As shown in FIG. 6, the shielding members 110 may be oriented along planes that are parallel to the longitudinal axis Y. However, the shielding members 110 may be oriented along the lateral axis X, with at least one of the shielding members 110 being positioned between the cables 108a and 108b.

More or less shielding members 110 than those shown may be used. For example, two shielding members 110 may be positioned between neighboring cables 108a and 108b. Further, the shielding members 110a and 110c on the outsides of the cables 108a and 108b, respectively, may be omitted.

Figure 7:
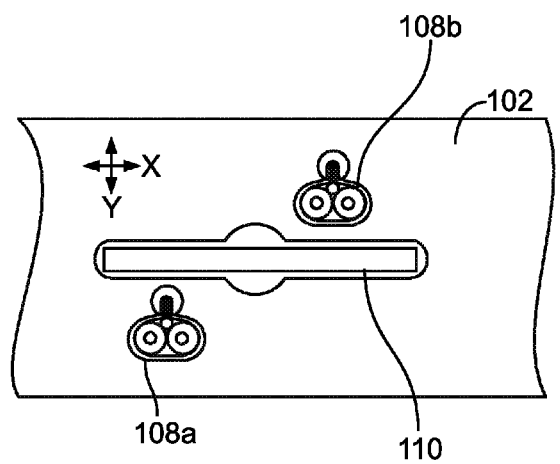
FIG. 7 illustrates a bottom view of a printed circuit board, according to an embodiment.

FIG. 7 illustrates a bottom view of the printed circuit board, according to an embodiment. In this embodiment, the shielding member 110 is positioned between the neighboring cables 108a and 108b and oriented along a plane that is parallel with the lateral axis X. Additional shielding members 110 may be positioned between and outside the cables 108a and 108b. Further, additional shielding members 110 may be positioned to the outside of the cables 108a and 108b in planes that are parallel to the longitudinal axis Y. Also, the shielding members 110 may be oriented in directions that are not parallel with the axes X and Y.

Figure 8:
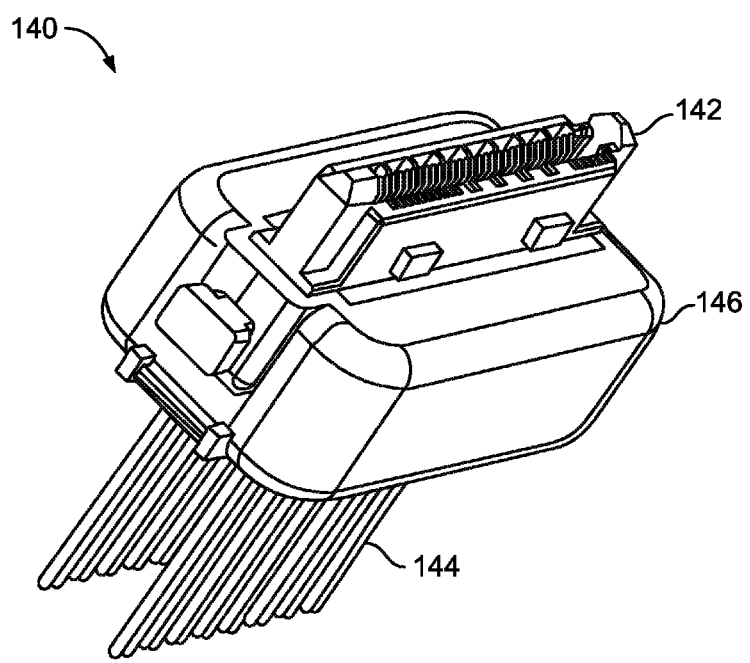
FIG. 8 illustrates a perspective view of a communication system, according to an embodiment.

FIG. 8 illustrates a perspective view of a communication system 140, according to an embodiment. The system 140 includes an electrical connector 142 connected to a PCB (hidden from view), which is in turn connected to cables 144. The system 140 is similar to the systems described above, except that a cover 146 surrounds the PCB. The cover 146 may be formed of molded plastic. For example, a communication system, such as those described above, may be positioned within a mold, and liquid plastic may be injected into the mold around top and side portions of the PCB. The plastic is then allowed to cool and set, thereby yielding the cover 146 that protects the PCB 12. The cover 146 enables one to grasp and manipulate the system 140 without damaging the internal components of the PCB.

Figure 9:
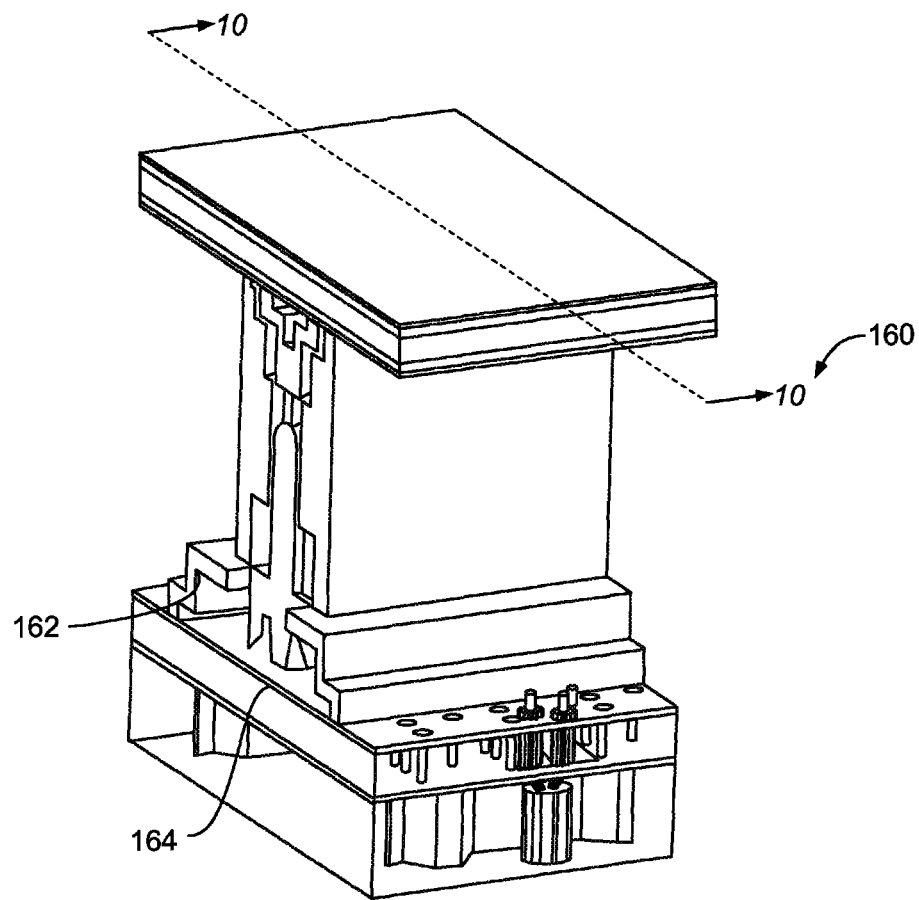
FIG. 9 illustrates a perspective view of a communication system, according to an embodiment.

FIG. 9 illustrates a perspective view of a communication system 160, according to an embodiment. In this embodiment, a non-conductive mask 162 may be positioned over a PCB 164.

Figure 10:
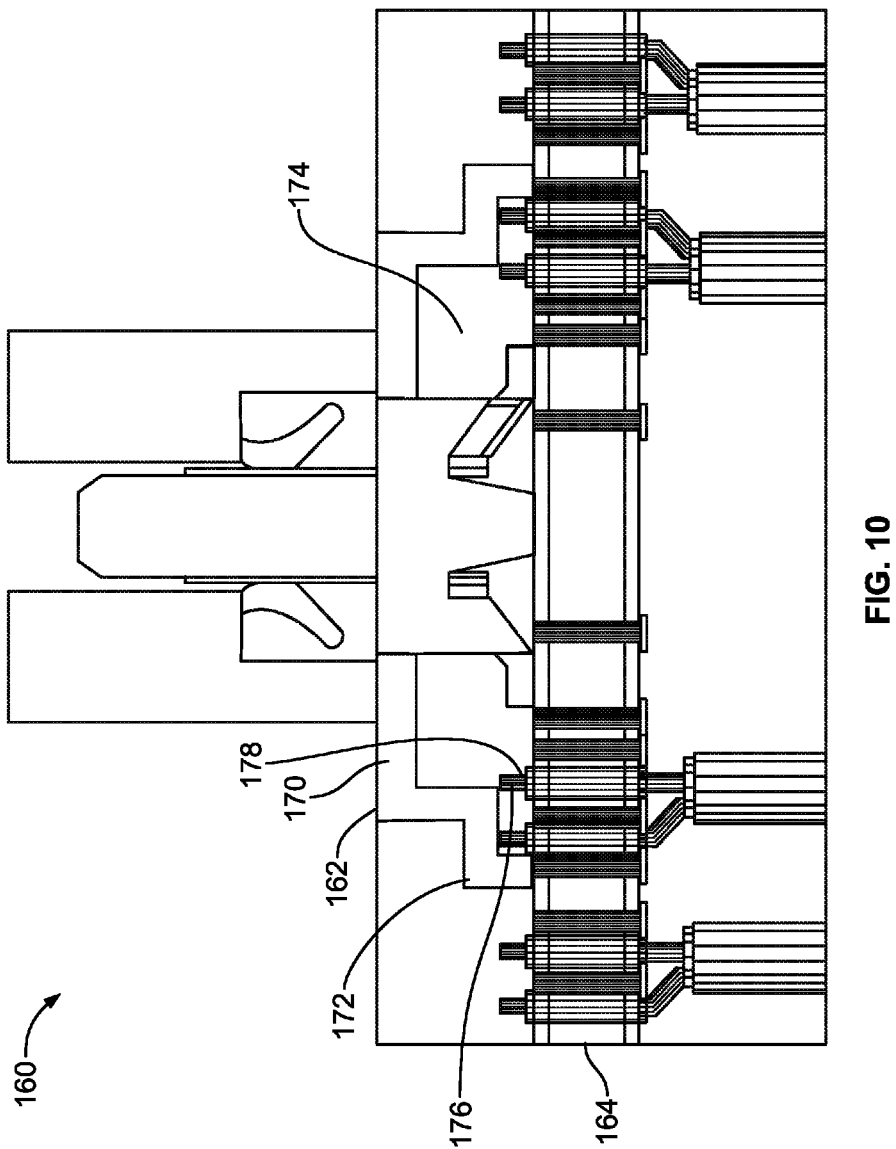
FIG. 10 illustrates a cross-sectional view of a communication system through line 10-10 of FIG. 9, according to an embodiment.

FIG. 10 illustrates a cross-sectional view of the communication system 160 through line 10-10 of FIG. 9, according to an embodiment. Referring to FIGS. 9 and 10, the non-conductive mask 162 includes a protective upper wall 170 connected to stepped supports 172 that abut against a top surface of the PCB 164. A gap 174 is defined between the non-conductive mask 172 and a portion of the top surface of the PCB 164. The non-conductive mask 172 is positioned on the PCB 164 prior to the molding process. The non-conductive mask 172 prevents the injection molded plastic from flowing onto the proximal ends 176 of the wires 178 and contacts of a connector.

The non-conductive mask 162 may span over more or less area of the PCB 164 that that shown. For example, the non-conductive mask 162 may span over an entire top surface of the PCB 164. Further, the non-conductive mask 162 may be various other shapes and sizes than that shown.

Thus, embodiments provide a system that minimizes or eliminates cross-talk between differential pairs within cables and printed circuit boards. Additionally, embodiments provide a system that efficiently utilizes the limited space of a printed circuit board. Further, embodiments provide a system that provides desirable, consistent, and reliable differential pair signal integrity.

It is to be understood that the above description is intended to be illustrative, and not restrictive. In addition, the above-described embodiments (and/or aspects or features thereof) may be used in combination with each other. Furthermore, many modifications may be made to adapt a particular situation or material to the teachings of the invention without departing from its scope.

While various spatial and directional terms, such as top, bottom, lower, mid, lateral, horizontal, vertical, front and the like may be used to describe embodiments, it is understood that such terms are merely used with respect to the orientations shown in the drawings. The orientations may be inverted, rotated, or otherwise changed, such that an upper portion is a lower portion, and vice versa, horizontal becomes vertical, and the like.

Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical communication system comprising:
a printed circuit board (PCB) including first and second ground plates and first, second, third, and fourth signal vias and first and second ground vias extending between the first and second ground plates, wherein the first, second, third, and fourth signal vias are electrically connected to first, second, third, and fourth conductive traces, respectively, on a surface of the PCB;
a first cable having first and second signal wires and a first ground wire extending therefrom, wherein the first and second signal wires define a first differential pair, wherein the first and second signal wires electrically connect to the first and second signal vias, respectively, and wherein the first ground wire connects to a first ground via; and
a second cable having third and fourth signal wires and a second ground wire extending therefrom, wherein the third and fourth signal wires define a second differential pair, wherein the third and fourth signal wires electrically connect to third and fourth signal vias, respectively, and wherein the second ground wire connects to a second ground via,
wherein the first cable is offset with respect to the second cable on the first and second ground plates and within the PCB with respect to at least one of two orthogonal axes.

2. The system of claim 1, wherein the first and second signal wires are symmetrical with respect to the first ground wire, and wherein the third and fourth signal wires are symmetrical with respect to the second ground wire.

3. The system of claim 1, further comprising an electrical connector mounted on the PCB, wherein the electrical connector comprises first, second, third, and fourth differential contact tails that electrically connect to the first, second, third, and fourth conductive traces, respectively.

4. The system of claim 1, wherein the PCB further comprises a plurality of shielding ground vias extending between the first and second ground plates.

5. The system of claim 4, wherein at least a portion of the plurality of shielding ground vias are positioned between the first and second differential pairs within the PCB.

6. The system of claim 4, wherein a first set of the plurality of shielding ground vias surrounds at least a portion of the first differential pair within the PCB, and wherein a second set of the plurality of shielding ground vias surrounds at least a portion of the second differential pair within the PCB.

7. The system of claim 1, wherein the PCB further comprises:
a first air pocket surrounding the first and second signal vias between the first and second ground plates; and
a second air pocket surrounding the third and fourth signal vias between the first and second ground plates.

8. The system of claim 1, further comprising at least one shielding member extending from the second ground plate, wherein the at least one shielding member is positioned between the first and second cables.

9. The system of claim 8, wherein the at least one shielding member is a planar plate.

10. The system of claim 8, wherein the at least one shielding member is formed of one of conductive plastic or metal.

11. The system of claim 1, further comprising a molded plastic cover over at least a portion of the PCB.

12. The system of claim 11, further comprising a non-conductive mask disposed between at least a portion of the PCB and the molded plastic cover.

13. An electrical communication system comprising:
a printed circuit board (PCB) including first and second ground plates and a plurality of signal vias and a plurality of ground vias extending between the first and second ground plates, wherein each of the plurality of signal vias are electrically connected to a respective conductive trace on a surface of the PCB; and
cables connecting to the PCB, wherein each of the cables has two signal wires and a ground wire extending therefrom, wherein the two signal wires define a differential pair, wherein each of the two signal wires electrically connects to a respective one of the plurality of signal vias, and wherein the ground wire connects to one of the plurality of ground vias,
wherein the cables are offset with respect to one another on and within the PCB.

14. The system of claim 13, wherein the two signal wires are symmetrical with respect to the ground wire.

15. The system of claim 13, further comprising an electrical connector mounted on the PCB, wherein the electrical connector comprises differential contact tails that electrically connect to the conductive traces.

16. The system of claim 15, wherein at least a portion of the plurality of shielding ground vias are positioned between neighboring differential pairs within the PCB.

17. The system of claim 13, wherein the PCB further comprises a plurality of shielding ground vias extending between the first and second ground plates.

18. The system of claim 15, wherein a first set of the plurality of shielding ground vias surrounds at least a portion of a first neighboring differential pair within the PCB, and wherein a second set of the plurality of shielding ground vias surrounds at least a portion of a second neighboring differential pair within the PCB.

19. The system of claim 13, wherein the PCB further comprises air pockets surrounding each of the plurality of signal vias between the first and second ground plates.

20. The system of claim 13, further comprising at least one shielding member extending from the second ground plate, wherein the at least one shielding member is positioned between neighboring cables.

21. The system of claim 13, further comprising:
a molded plastic cover over at least a portion of the PCB; and
a non-conductive mask disposed between at least a portion of the PCB and the molded plastic cover.

* * * * *